United States Patent
Michallick et al.

(10) Patent No.: US 10,670,649 B2
(45) Date of Patent: Jun. 2, 2020

(54) BONDWIRE TESTING OF IC USING PIN DIODE SIGNATURES

(71) Applicant: Texas Instruments Incorporated, Dallas, TX (US)

(72) Inventors: Ronald Andrew Michallick, McKinney, TX (US); Michael Nolan Jervis, McKinney, TX (US); David Anthony White, McKinney, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 85 days.

(21) Appl. No.: 15/887,702

(22) Filed: Feb. 2, 2018

(65) Prior Publication Data
US 2019/0242940 A1 Aug. 8, 2019

(51) Int. Cl.
  *G01R 31/04* (2006.01)
  *G01R 31/28* (2006.01)
(52) U.S. Cl.
  CPC ................. *G01R 31/2853* (2013.01)
(58) Field of Classification Search
  CPC . H01L 2224/48227; H01L 2224/48463; H01L 2924/14; H01L 24/48; H01L 2224/0401; H01L 24/49; H01L 22/34; H01L 2223/6611; H01L 2224/85; H01L 2224/4813; H01L 2224/49113; H01L 2224/04042; H01L 2224/48247; H01L 2224/49431; H01L 24/02; H01L 24/73; H01L 27/0688; G01R 31/2884; G01R 31/2853; G01R 27/14; G01R 31/3163; G01R 31/31717; G01R 31/31924; G01R 35/00; G01R 31/2886; G01R 31/3004; G01R 19/0092; G01R 31/31716; G01R 31/327; G01R 21/12; G01R 31/2851; G01R 31/31713; G01R 31/31715; G06F 11/221

See application file for complete search history.

(56) References Cited

U.S. PATENT DOCUMENTS

| | | | | |
|---|---|---|---|---|
| 5,963,038 A * | 10/1999 | De Jong | ............ | G01R 31/3173 324/127 |
| 6,586,921 B1 * | 7/2003 | Sunter | ............ | G01R 31/318552 324/76.11 |
| 6,677,741 B2 * | 1/2004 | Taylor | ............ | G01R 25/00 324/658 |
| 7,279,921 B1 | 10/2007 | Iacob | | |
| 10,325,836 B1 * | 6/2019 | Rigoni | ............ | H01L 23/4952 |

* cited by examiner

*Primary Examiner* — Vinh P Nguyen
(74) *Attorney, Agent, or Firm* — Ronald O. Neerings; Charles A. Brill; Frank D. Cimino

(57) ABSTRACT

A method of bondwire integrity testing a packaged IC includes forcing a pin current or pin voltage level sufficient to forward bias a parasitic diode at a plurality of pins relative to a selected reference pin. The pins are connected to bond pads (BPs) on the IC by a bondwire. The bond pads coupled to a diffusion of a first type that forms the parasitic diode (D) with a region doped the second type coupled to a bondpad wirebonded to the reference pin. The resulting pin voltages or pin currents at measured, and present pin-pin relationships are determined. The present pin-pin relationships are compared to stored pin-pin relationship data for a device design of the IC. Results from the comparing are used to determine whether any present pin-pin relationships are significantly different as compared to the stored pin-pin relationships to identify a bondwire problem for at least one pin.

28 Claims, 8 Drawing Sheets

SORTED LIST BY Ω

| Group | Pin | Ω |
|---|---|---|
| 5 | PIN 4 | 8.8Ω |
| 4 | PIN 14 | 13.9Ω |
| 4 | PIN 8 | 14.3Ω |
| 4 | PIN 7 | 14.4Ω |
| 4 | PIN 1 | 14.4Ω |
| 3 | PIN 10 | 15.7Ω |
| 3 | PIN 12 | 16.1Ω |
| 2 | PIN 9 | 17.5Ω |
| 2 | PIN 13 | 17.7Ω |
| 1 | PIN 5 | 23.5Ω |
| 1 | PIN 3 | 23.8Ω |
| 1 | PIN 6 | 23.9Ω |
| 1 | PIN 2 | 24.1Ω |

FIG. 4A

SORTED LIST BY Ω

| GROUP | MINIMUM | SPREAD |
|---|---|---|
| 5 | 8.77Ω | 0.0% |
| 4 | 13.85Ω | 4.0% |
| 3 | 15.74Ω | 2.3% |
| 2 | 17.54Ω | 0.9% |
| 1 | 23.46Ω | 2.6% |

FIG. 4B

| ADJACENT PAIRS | | STEP |
|---|---|---|
| 3 | 2 | 10.8% |
| 4 | 3 | 12.7% |
| 2 | 1 | 23.5% |
| 5 | 4 | 39.4% |

FIG. 4C

| KEY | TYPICAL | KEY STEPS |
|---|---|---|
| PIN4 | 778.83 mV | n/a |
| PIN12 | 934.52 mV | 18.2% |
| PIN10 | 934.69 mV | 0.0% |
| PIN13 | 945.30 mV | 1.1% |
| PIN9 | 946.40 mV | 0.1% |
| PIN2 | 947.54 mV | 0.1% |
| PIN6 | 947.82 mV | 0.0% |
| PIN1 | 949.42 mV | 0.2% |
| PIN7 | 951.17 mV | 0.2% |
| PIN14 | 951.29 mV | 0.0% |
| PIN8 | 952.44 mV | 0.1% |
| PIN5 | 966.06 mV | 1.4% |
| PIN3 | 966.35 mV | 0.0% |

FIG. 9A

| TEST | DUT READS | TEST STEPS |
|---|---|---|
| PIN4 | 766.20 mV | n/a |
| PIN12 | 920.84 mV | 18.3% |
| PIN10 | 914.16 mV | -0.7% |
| PIN13 | 960.24 mV | 4.9% |
| PIN9 | 954.32 mV | -0.6% |
| PIN2 | 924.28 mV | -3.2% |
| PIN6 | 960.32 mV | 3.8% |
| PIN1 | 928.96 mV | -3.3% |
| PIN7 | 930.72 mV | 0.2% |
| PIN14 | 930.52 mV | 0.0% |
| PIN8 | 933.92 mV | 0.4% |
| PIN3 | 943.28 mV | 1.0% |
| PIN5 | 944.96 mV | 0.2% |

FIG. 9B

| KEY STEP | TEST STEPS | ERROR | LIMIT |
|---|---|---|---|
| 18.2% | 18.3% | 0.2% | +/-1.8% |
| 0.0% | -0.7% | -0.7% | +/-0.2% |
| 1.1% | 4.9% | 3.8% | +/-0.2% |
| 0.1% | -0.6% | -0.7% | +/-0.2% |
| 0.1% | -3.2% | -3.3% | +/-0.2% |
| 0.0% | 3.8% | 3.8% | +/-0.2% |
| 0.2% | -3.3% | -3.5% | +/-0.2% |
| 0.2% | 0.2% | 0.0% | +/-0.2% |
| 0.0% | 0.0% | 0.0% | +/-0.2% |
| 0.1% | 0.4% | 0.2% | +/-0.2% |
| 1.4% | 1.0% | -0.4% | +/-0.3% |
| 0.0% | 0.2% | 0.1% | +/-0.2% |

FIG. 9C

BONDWIRE TESTING OF IC USING PIN DIODE SIGNATURES

FIELD

This Disclosure relates to bondwire integrity testing for packaged integrated circuits.

BACKGROUND

Wire bonding is a common, cost-effective and flexible interconnect technology for making interconnections between the bond pads of an earlier successfully probed integrated circuit (IC) die and its packaging (leads of its leadframe) during semiconductor device assembly. The IC die is generally placed onto a lead frame, wire bonded to connect the bond pads of the IC die to leads of the lead frame, and the IC and the leadframes is then encapsulated in a plastic molding material.

The reliability of a wirebonded packaged IC device during performance of its function in its application is dependent on the quality of the wirebond interconnections. The quality of a wirebond is determined by the strength of the interfaces between the bondwires and the bond pads, as well as between the bondwires and the lead fingers.

Bondwires can comprise aluminum, copper, silver, or gold. Copper bondwires are comparatively low in cost as compared to gold bondwires, and have the ability of being used at smaller diameters providing the same performance as gold. However, copper bondwires significantly increase the risk for bondwire-related time zero defects and future bondwire-related continuity induced failures.

Bondwire integrity testing can be electrically-based or non-electrically-based. Non-electrically-based bondwire integrity testing methods includes bond pull testing, ball-bond shear testing, and visual inspection. However, once the molding is completed, non-electrically-based bondwire integrity testing other than X-ray imaging are no longer possible. X-ray imaging allows a visual inspection of wirebonds of the package. However, a problem with X-rays is that the image is not always clear, and the manual process of inspecting X-ray images is generally slow and imprecise.

In a known electrical bondwire integrity testing method, almost every pin of a packaged IC device can be checked by using a conventional Electrostatic Discharge (ESD) cell that has a diode characteristic when tested while referenced to ground. Older IC devices without ESD cells have a parasitic diode referenced to ground. A small amount of current is provided 'backwards' to a VSS pin from signal pins being bondwire integrity tested. The current is used to forward bias the diode coupled between the signal pin and the VSS pin. The current passes through the respective bondwires and bondwire interfaces to the bond pads (ball and stitch bonds on the bond pads), with the resulting voltage drop being the current multiplied by bondwire and interface resistances, will be present on the signal pin as a voltage.

Electrically-based bondwire integrity methods also include contact resistance (CRES) testing which also depends on the parasitic diode forward conduction paths. CRES testing also needs two separate read points to determine the CRES. CRES testing uses fixed limits set using a full package test bondwire integrity process distribution (over many package test lots) which results in wide CRES test limits, thus rendering the CRES method a generally insensitive bondwire integrity test method.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes the need for a new bondwire integrity test method for final testing of packaged ICs for identifying poor or faulty bondwire connections between the leadframe and the bond pads on the IC die. It is also recognized that most packaged ICs utilizing bondwires have pins connected to bond pads on the IC die which connect to a parasitic diode comprising a diffusion of a first doping type that forms a pn junction with a region doped the second doping type that is typically the substrate, which is often the ground pin for the IC package. The parasitic diode is a natural consequence of ESD protection and junction isolated IC substrates that are electrically in parallel to the intended circuit path on the IC for protecting the IC circuitry (e.g., transistors) coupled to the pins from ESD events which can result in potentially damaging pin voltages to the IC circuitry being applied to the respective pins (e.g., signal pins) of the IC.

Disclosed methods apply at least one current or voltage having a level and a polarity sufficient to forward bias the parasitic diode at each of a plurality of pins of interest of the packaged IC, each pin tested relative to a selected common reference pin. The reference pin can be a ground pin or a power supply pin (e.g., VCC). At least one resulting pin voltage (or pin current in the case of an applied voltage) is then measured from each of these tested pins. Present pin-pin relationships (from pin to pin measured value differences) are determined from respective pin voltages or respective pin currents. The present pin-pin relationships are compared to stored pin-pin relationship data for a device design of the IC device that provides relationships between the plurality of pins from previous bondwire integrity testing. Results from the comparing are utilized to determine whether any of the present pin-pin relationships are significantly different as compared to the stored pin-pin relationships to identify any bondwire integrity problems that may be present for any of the plurality of pins of the packaged IC. The determination of bondwire integrity is exclusive of conventional external resistors coupled to the pins.

A significant aspect in this Disclosure is that direct (i.e., unprocessed voltage, current, or impedance) is not directly tested as in known bondwire integrity testing. The unprocessed voltage, current or impedance values are instead compared to other unprocessed voltage, current or impedance values though calculations before any test limits are applied. This reduces unwanted sources in the measured values including the normal substrate resistance, diode forward voltage, and even bondwire resistance. What remains after disclosed differencing is thus mostly abnormal substrate resistance, abnormal diode forward voltage, and abnormally high bondwire resistance.

BRIEF DESCRIPTION OF THE DRAWINGS

Reference will now be made to the accompanying drawings, which are not necessarily drawn to scale, wherein:

FIG. 4A shows results after selecting 2 test currents and creating pin groups for a 14 pin device.

FIG. 4B shows results after converting the pin group data in shown FIG. 4A to a diode signature key having a group spread for each pin group.

FIG. 4C shows results after converting the pin group data shown in FIG. 4A to a diode signature key having group step data shown as a % difference between adjacent pin groups.

FIGS. 9A-C show an example of implementation of a rapid automated method of bondwire testing a packaged IC device.

DETAILED DESCRIPTION

Figure 1:
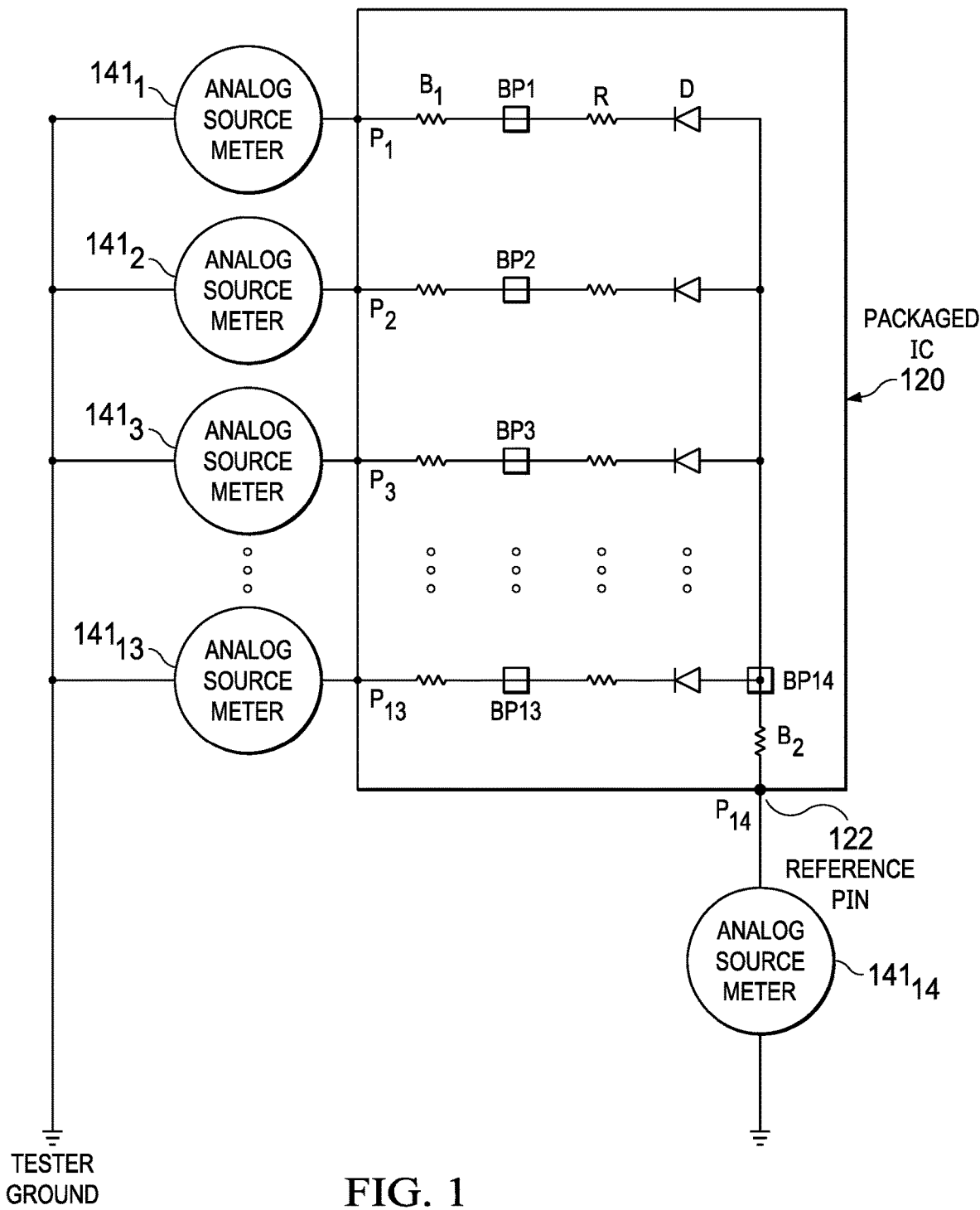
FIG. 1 shows a packaged IC as a device under test (DUT) having a testing arrangement coupled thereto used to describe how internal diodes on the IC can be used to measure bondwire integrity.

Example aspects in this disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 shows a packaged IC 120 having a testing arrangement coupled thereto used to describe how measurements of internal parasitic diodes on the IC die can be used based on relationships between results from respective IC pins to measure bondwire integrity. The forcing of current at the pins has an advantage over forcing voltage at the pins due to the known shape of the diode i-v curve. Accordingly, this Disclosure will generally refer to the forcing of pin current and the measuring of pin voltage, with the understanding that voltage can be also forced at the pins and current measured as well.

The bond pads of the packaged IC 120 are shown as BP1, BP2, BP3 . . . BP13, and BP14. Everything outside box shown representing the packaged IC 120 is the testing arrangement provided by the packaged IC test equipment. The testing arrangement shown comprises an analog source meter $141_1$ to $141_{14}$ for forcing pin current and a voltage measurement circuit for measuring resulting pin voltage, both being relative to a selected reference pin 122. All pins of the packaged IC 120 thus have an analog resource that is connected to each of the DUT pins. The analog source meters can be either dedicated to each pin as shown in FIG. 1, or alternatively be relay selectable to enable the number of analog source meters to be less than the number of pins. Conventional IC testers have analog source meters that can source current or voltage while measuring voltage or current.

In operation, for example, the analog source meters $141_1$ to $141_{13}$ for pins 1 to 13 can be programed to say −10 mA (one at a time or in sets, based on the programmer's preference) and the analog source meter $141_{14}$ for pin 14 shown as reference pin 122 can be programed to 0V. The voltage results from the analog source meters $141_1$ to $141_{13}$ will be passed to math equations then compared to a disclosed diode signature key.

It is recognized that almost all pins of an IC of various types has a parasitic diode path to ground, VCC, or some other reference pin. The diode voltage in FIG. 1 is shown as D. A forced current from the analog source meters $141_1$ to $141_{13}$ acting as a current source can be passed from any of the pins 1 to 13 shown on the left side of the packaged IC 120 through respective bondwire resistances (B) shown as $B_1$ and $B_2$ for one current path from pin 1 flowing current out of the reference pin 122. The resulting voltage across the B's for this path will be $I*B_1$ and $I*B_2$. The measured voltage measured by the analog source meter $141_1$ is $I*(B_1+B_2+R)+D$.

D which is generally about −0.6 V to −0.75 V which is typically greater than the voltage across the diode resistance (R) which is equal to I*R, that is generally much greater than the bondwire voltage I*(B+B). R can vary from device to device, and from lot to lot, such as due to substrate (or epitaxial) doping differences. Because I*B voltages are small and the I*R values vary with the wafer fabrication process, a diode signature key as used in this Disclosure that due to differencing of pin measurements benefits from inherent process matching within the IC die, and within IC die in a packaged IC lot, to enable accurately verifying whether the B's are normal (i.e., not too high in resistance).

Unlike known bondwire integrity methods the pin voltage value or impedance value (impedance is obtained from 2 measured pin voltage values) that includes all sources of resistance is not bondwire integrity tested by test limits. The conventional test limits are instead replaced by disclosed diode signature key expectations that are generally applied to the calculated intragroup spread of pin groups and intergroup steps between respective pin groups that reject common mode effects of the IC die's D, R and B being tested to detect low quality bondwire connections (e.g., abnormally high resistance bond pad or lead finger connections) with a high accuracy.

Disclosed bondwire testing can use a known diode signature key (obtained from previous package test lots) or learned from the current package test lot diode signature key. Known electrical-based bondwire integrity solutions, namely CRES as described above, need separate read points to extract the bondwire resistance, then uses fixed limits set using a full process distribution across a plurality of test lots resulting in wide limits that thus ignores any relationship between the respective IC pins tested. In contrast, disclosed device diode signature keys including pin diode data and relationships between the respective are used to provide a new bondwire integrity solution.

The disclosed diode signature key method largely eliminates the effects of process and temperature variances because all pin diodes associated with IC pins of the DUT share the same process (fabrication process and assembly process) and temperature, and pin measurements are differenced. Both similarities and differences between respective pin diodes can be measured to detect even very small changes in B because disclosed diode signature calculations are based on a difference value, and limits applied to voltage or impedance differences are based on expectations of the values (from characterization data) that are preprogrammed or even learned from recently tested packaged IC devices.

For example, for one example pin group (say a group of 3 pins) where impedance differences are measured, 2.3% of 15.74 Ω is 0.36Ω, so that a total mismatch error larger than 0.36Ω, can be detected. This can be seen to be a more sensitive measure of bondwire integrity since the parasitic diode's silicon bulk resistance (R) can vary by process by +/−15% which would have an uncertainty of +/−2.36 Ω for a nominal impedance of 15.74 Ω without disclosed differencing at final package IC test can lead to a future device failure. Therefore the high sensitivity provided can reduce future packaged IC device failures.

The IC device's diode signature key can match the bondwire integrity performance shared by some pins of the IC that constitute one or more 'pin groups'. However, pin grouping is not always required. Pin grouping is generally needed for visual inspection of device performance due to limitation of the human eye mind connection. However for automated testing each pin group can be split into individual groups of only one pin member, thus no longer a group, and at this point the disclosed key step spacing aspect will be applied. This is helpful to a group which has a rather large spread, but not needed for a tight group. Nevertheless, there is generally no harm in splitting a tight group into individual steps key specifications, 'expectations', and can optionally also include known performance mismatches between sets of pin groups.

As described above, the device signature keys can be preprogrammed based on being obtained from stored historical pin current, voltage performance data for the particular IC device design, or can be learned from packaged IC samples in recent test lot results that can be used to generate step expectations, and diode key signature. In self-learning mode groups will generally not be identified. However the step spacing would typically be very small for pins that would normally called members of a group.

Generally all pins of the packaged IC are tested except the reference pin. The reference pin is typically selected as the ground pin or other non-signal pin (e.g., as a power supply pin). However the ground or other reference pin is still indirectly checked for bondwire integrity as it is part of all disclosed measurements. The pin voltages measured for a single current level applied or pin impedance calculated from multiple current levels applied are compared to a known diode signature key for that particular IC device that contains predefined (i.e., presorted) voltage or impedance expectations for what is termed pin group(s) that each having voltage or impedance values. Differences between adjacent pin groups may also be defined. It is recognized that signal pins that use a symmetric layout that are identically sized will have highly matching diode characteristics and therefore be will grouped together in a group. The self-correlation of the group's diode performance is used to detect any extra bondwire resistance that make a signal pin perform differently (higher voltage or higher impedance) as compared to the other members of its group.

Value expectations can include an intragroup spread which is ([maximum value in the group]−[minimum value in the group])/[minimum value of group] which will generally only have a maximum test limit. Expectations can also include intergroup step spacing which is ([minimum value of larger group]−[minimum value of lesser group])/[average of minimum values of both groups], which will have a minimum or maximum test limits as the step is a difference of a known size. The exact utilized formulas can vary, but the disclosed concept is to detect differences within groups and optionally between groups that are more than expected as compared to previously characterized diode signature key data.

Figure 2:
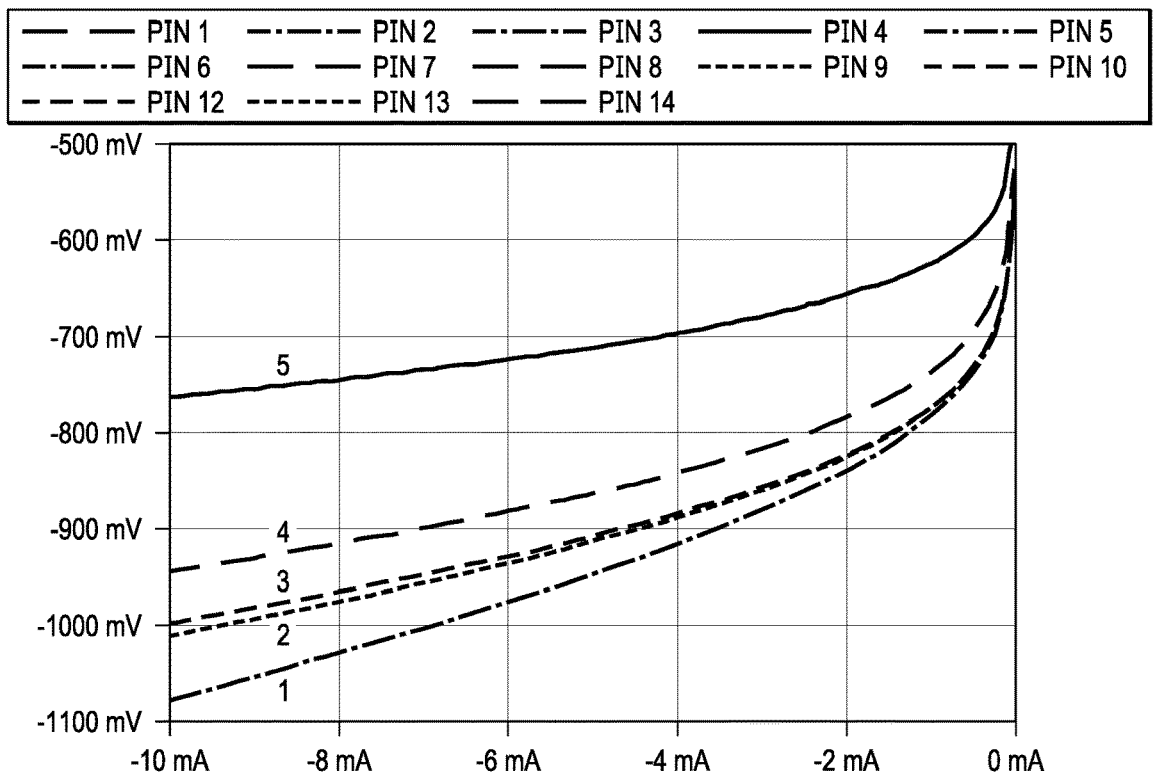
FIG. 2 shows example I-V pin data for a 1 measurement diode characteristic implementation obtained from a 14 pin device.

FIG. 2 shows example I-V pin data for a 1 measurement diode characteristic implementation obtained from a 14 pin device comprising a quad operational amplifier from Texas Instruments Incorporated being the LM2904QDR. Pin 11 is the ground pin for this device. Current sweeps were performed. At −10 mA, there are 5 distinct pin groups shown as 1 (pins 2, 3, 5 and 6), 2 (pin 9 and 13), 3 (pin 10 and 12), 4 (pin 1, 7, 8 and 14) and 5 (pin 4). At −4 mA there are 4 distinct groups (groups 2 and 3 overlap). For a single test measurement it is generally best to use higher current so that the bondwire resistance (B) has more effect as compared to D which is about −0.7V with little current dependence.

Figure 3:
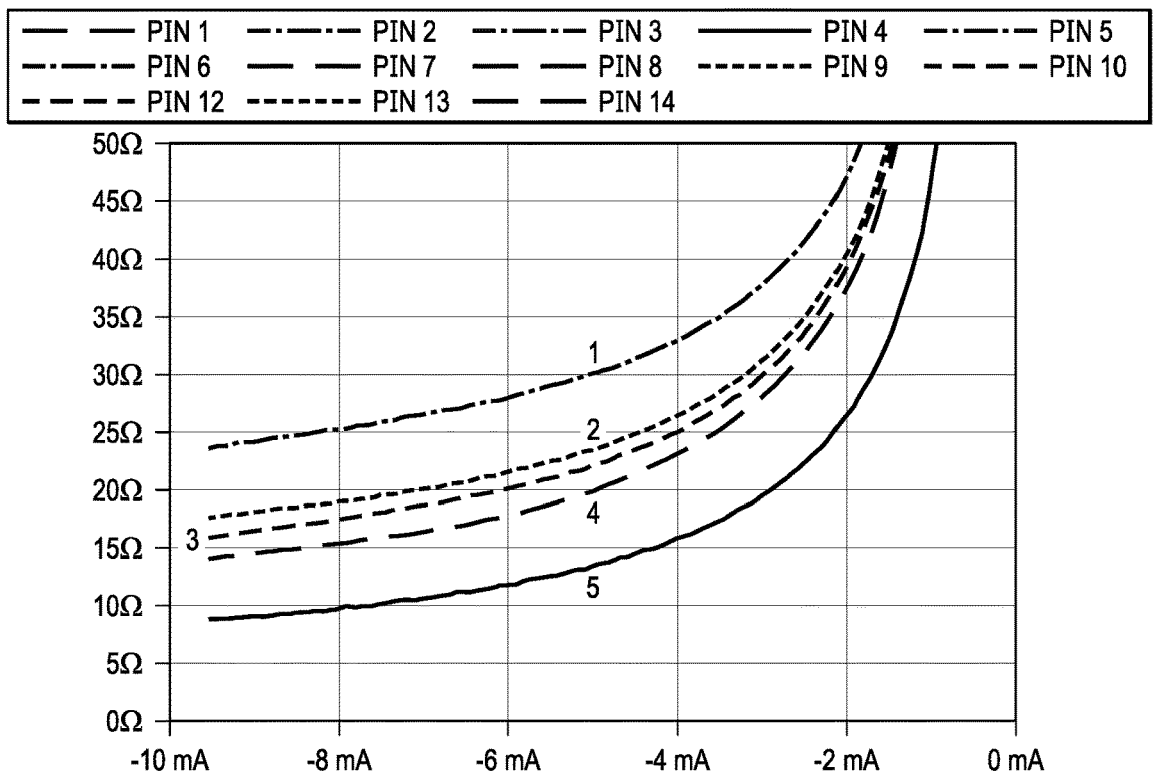
FIG. 3 shows example impedance pin data obtained from a 2 voltage measurement diode characteristic implementation for each DUT pin tested for a 14 pin device.

FIG. 3 shows example impedance data obtained from a 2 voltage measurement diode characteristic implementation for each DUT pin tested from a 14 pin device. 5 pin groups are shown (same as in FIG. 2) as group 1 (pins 2, 3, 5 and 6), 2 (pin 9 and 13), 3 (pin 10 and 12), 4 (pin 1, 7, 8 and 14) and 5 (pin 4). Changing from voltage to impedance (Z) shows a more accurate total resistance measure for the B's with less effect from D. Z can be obtained from the 2 measurements by the analog source meters at the pins using the following equation, where a 1 mA spread in currents is used only as an example. Z is always $\Delta V/\Delta I$ (by definition), Z is based on $B+B+R+60$ mV*$\log(I_1/I_2)$, where the last (the log) term is diode forward voltage change, which is why low current curves up when graphed. There is no need for the diode signature key and the DUT to use the same two currents for Z. The diode signature key and the DUT should generally use the same two currents, as this creates the best desired rejection of the R and D terms.

$$Z=(V[I+500\mu V]-V[I-500\mu V])/1000\mu V$$

Although a 1 mA spread in current is shown selected in this Z equation, any other current span (difference) can be used. As described above, a two current test measurement, expressed as a single impedance value Z, can improve the bondwire integrity test accuracy.

FIG. 4A shows results after selecting 2 test currents and creating pin groups for a 14 pin device, here having close Z values in each group, shown as 5 groups, group 1, 2, 3, 4 and 5, where pin 4 is its own 'group', being group 5. A test current or two test currents (for Z shown here) should be selected based on test time and tester capability and bondwire detection requirements. In this example a more accurate dual-measurement is be used (9 mA and 10 mA). However, the following grouping steps apply equally to one measurement test plan, where similar performance pins are group together because groups give self-correlation power.

FIG. 4B shows results after converting group data shown in FIG. 4A to a diode signature key having a group spread in Z for each group. The group spread is calculated and saved within each group set. Within each group, minimum and maximum magnitude values are found. The spread of this group is set to (maximum−minimum)/minimum. Test limits are made for group spread and step spacing for the best test coverage and yield. The maximum test limit should generally be a little larger than measured spread. There is no need for a minimum test limit. Pin groups with only one member (such as group 5 in this example) do not need to be tested.

FIG. 4C shows results after converting group data in FIG. 4A to a diode signature key having group step data shown as a % difference in Z between groups. The step spacing between pairs of different groups set are calculated and saved. For every pair of adjacent groups, the group step spacing is calculated as (first group's minimum−second group's minimum)/(average of both minimums). Test limits are made for variance spread and step spacing for the best test coverage and yield. Minimum and maximum limits can be set with the measured value centered within the limits.

Figure 5:
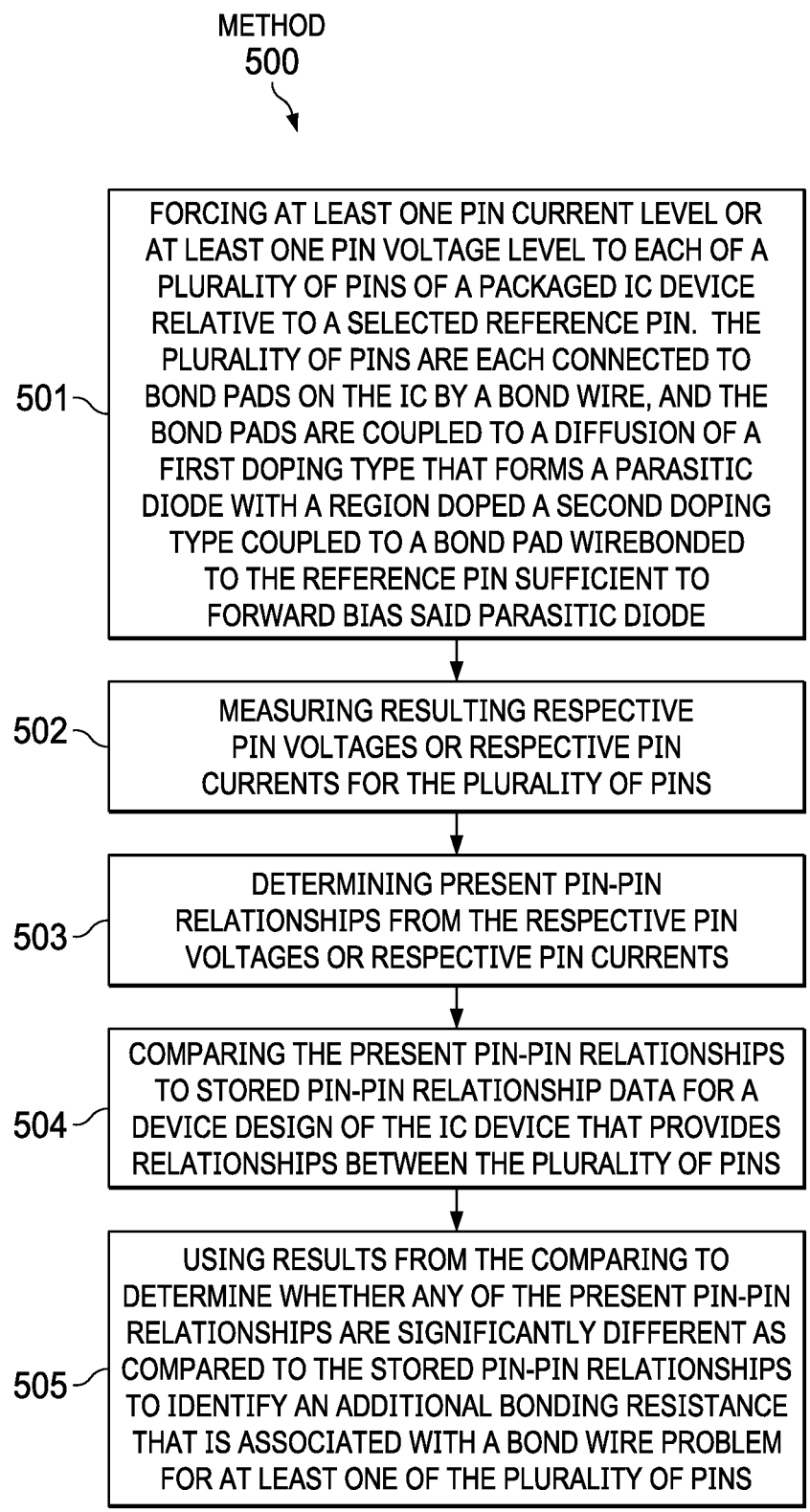
FIG. 5 is a flow chart that shows in an example method of bondwire integrity testing packaged IC devices.

FIG. 5 is a flow chart that shows in an example method 500 of bondwire integrity testing packaged IC devices. Step 501 comprises forcing at least one pin current level or at least one pin voltage level to each of a plurality of pins of a packaged IC device relative to a selected reference pin. The plurality of pins are each connected to bond pads on the IC by a bondwire, and the bond pads are coupled to a diffusion of a first doping type that forms a parasitic diode with a region doped a second doping type coupled to a bond pad wirebonded to the reference pin sufficient to forward bias the parasitic diode. In most devices packaged IC devices the GND (V−) pin is common anode for the respective diodes. Some devices will also have VCC (V+) pin as a common cathode. This Disclosure still applies to devices with a VCC pin as a common cathode, where only the polarity of current and voltage are changed.

Step 502 comprises measuring resulting respective pin voltages or respective pin currents for the plurality of pins. Step 503 comprises determining present pin-pin relationships from the respective pin voltages or respective pin currents. One can form a plurality of pin groups from the plurality of pins by matching resulting respective pin voltage or respective pin current, and using the pin groups so that the pin-pin relationship data includes group-to-group relationship data. Step 504 comprises comparing the present pin-pin relationships to stored pin-pin relationship data for a device design of the IC device that provides relationships between the plurality of pins.

Step 505 comprises using results from the comparing to determine whether any of the present pin-pin relationships are significantly different as compared to the stored pin-pin relationships to identify an additional bonding resistance that is associated with a bondwire problem for at least one of the plurality of pins. A common bondwire problem is a poor interconnection of bond ball or stitch bond interface to the bond pad, which can worsen over time and temperature stress (soldering and usage environment), which can degrade to a full open contact usually intermittently which is the worst kind of package IC failure.

Disclosed bondwire integrity testing can be implemented generally on any conventional IC tester. The IC tester generates test pattern signals, say currents, supplies them to corresponding terminal pins of a packaged IC being tested at suitable timing, and measures respective voltages (for forced currents) that are processed by a suitable processor as differences to reduce effect of D and R so that the B variance is the dominant effect remaining. The outputs from suitable processor are compared to the expected stored values (using a disclosed diode signature key) to determine whether the IC being tested has acceptable bondwire integrity or not.

Figure 6:
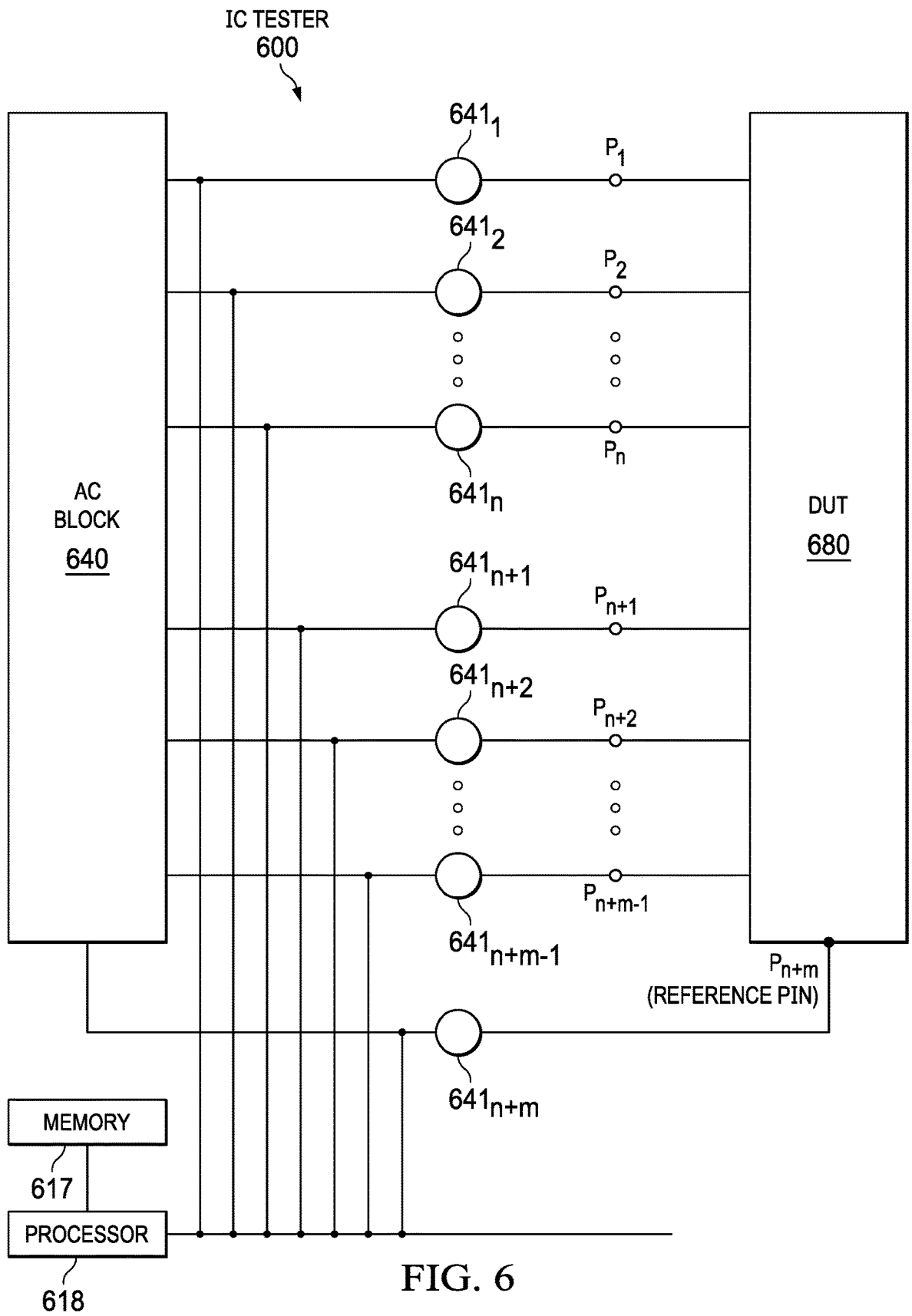
FIG. 6 shows a block diagram depiction components of an automated IC tester for bondwire testing of a packaged IC device that utilizes a stored diode signature key for the IC device which includes pin diode data and relationships between the respective pins that is used for testing the integrity of the various bondwires associated with the pins of a packaged IC.

FIG. 6 shows a block diagram of an IC tester (or test system) 600 showing its components for bondwire integrity testing of a packaged IC shown as DUT 680 along with an AC function generation and timing block 640 (shown as an AC block 640 in FIG. 6) for performing AC tests on the DUT that is not related to this Disclosure. As known in the art, AC function generation and timing block 640 comprises a timing signal generator (TSG) for supplying a fundamental clock signal (a synchronous signal) to a pattern generator that generates test pattern signals and expected-value signals parallel to each other in response to a fundamental clock signal. The test pattern signals are supplied to a group of waveform shaper circuits in which the signals are shaped to predetermined logic waveforms, which are then fed out at desired timings.

The DUT 680 is shown including terminal pins P1 to Pn+m−1 and one reference pin Pn+m. As known in the art, The DUT being a packaged IC is in a contactor for contacting the respective pins of the DUT 680. Each pin is shown having its own analog source meter $641_1$ to $641n+m$. IC tester 600 is shown including a processor 618 (e.g., microcomputer) that utilizes a disclosed diode signature key stored in an associated memory 617 for the particular IC device design for the DUT 680. As described above the diode signature key includes pin diode data and relationships between the respective pins for the particular IC that the DUT includes that is used for testing the integrity of the wirebonds associated with the pins of the DUT 680. The analog source meter $641_1$ to $641_{n+m-1}$ at each pin to be tested (P1 to $P_{n+m-1}$) are controlled by the processor 618. The processor 618 enables the reference pin $P_{n+m}$ and one or more terminal pins. The resulting analog voltage from a forced current (or resulting current from a forced voltage) result is saved in the memory 617. This process is generally repeated with the remaining terminal pins until all pins (other than the reference pin) have been measured.

Outputs from the terminal pins $P_1$ to $P_{n+-1}$ saved in memory 617 are compared by the processor 618 to each other using math functions described above. The processed results from the test terminal comparisons are compared to a previously set diode signature key which is the processed results from known good DUT(s) for the particular IC device design. If the difference between the DUT being tested and the diode signature key is within program test limits for all the comparisons then the DUT being tested is deemed to have acceptable bond integrity. If any difference between DUT being tested and the diode signature key exceeds the test limit, then the DUT being tested is deemed a reject due to high bondwire resistance.

EXAMPLES

Disclosed aspects are further illustrated by the following specific Examples, which should not be construed as limiting the scope or content of this Disclosure in any way.

Figure 7:
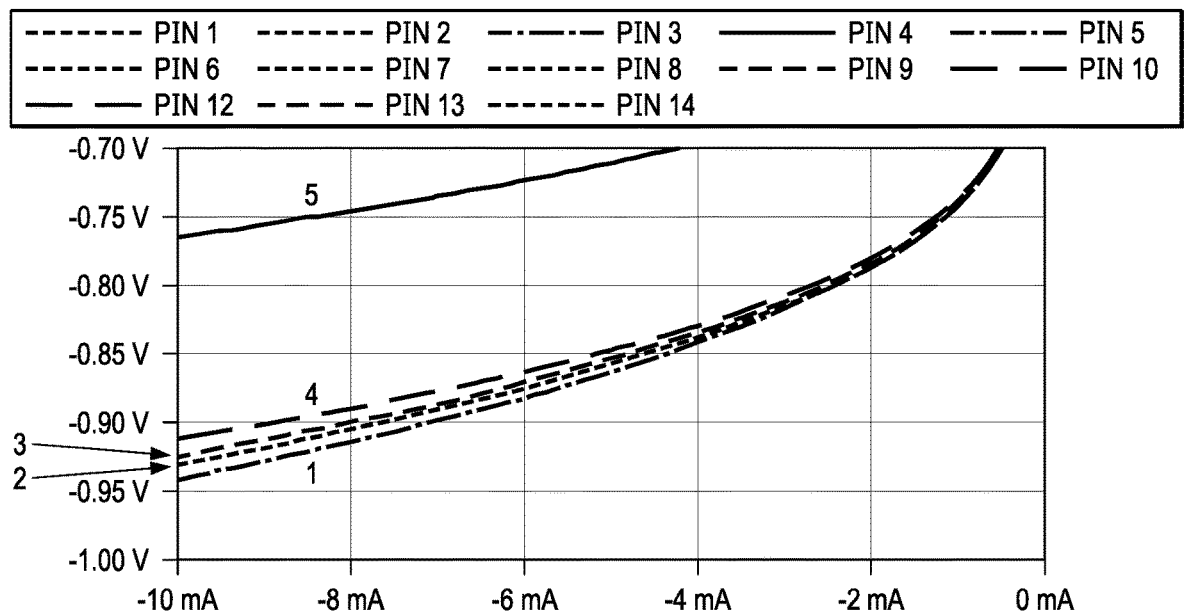
FIG. 7 shows example diode signature data obtained from a particular plastic packaged quadruple operational amplifier IC device, and explanations how disclosed diode signature data can be used to determine bondwire integrity for the respective pins tested.

FIG. 7 shows example diode signature data obtained from a 14 pin plastic packaged quadruple operational amplifier device from Texas Instruments Incorporated, LM324, and a further explanation how diode signature data can be used to determine bondwire integrity for the respective pins tested. The diode signature data comprised diode signature curves shown as groups 1, 2, 3, 4 and 5 that were obtained from lab bench testing that comprised pin parasitic diode to ground characterization curves for the respective pins.

For the LM324 pin 11 is the common ground (where pin 11 is directly connected a p-substrate) and pin 4 is the power supply pin $V_{CC}$. There are no diodes at the bond pad to the $V_{cc}$ pin for this particular IC device. However, diodes when present at the $V_{CC}$ pin can also be incorporated in the diode signature key. For this particular IC device, each of the other pins connect to bond pads on the IC die which are coupled to n-diffusions which form a parasitic pn junction (diode) with the p-type substrate. As known in the art, silicon pn junction (silicon diodes) have a typical voltage required to turn the diode on called the forward voltage ($V_F$), referred to above as D, of about 10.7 VI, and when the voltage gets to about the $V_F$ rating, large increases in current result in relatively small increases in voltage. This is why current(s) are preferred to be forced, not voltage.

FIG. 7 shows applied current (x-axis) and resulting pin voltage (y-axis) measured relative to pins 1-10 and pins 12-14, all relative to pin 11 functioning as the reference pin (the common ground for this IC). The current used in the pin testing is generally always below the maximum forward current for the parasitic diodes that would result in a destructive test. The i-v curves shown for the respective pins tested can all be seen to resemble that of silicon diodes. The diode i-v forward response dominates the curve shape. Essentially identical matching pin diode performance each represents a pin group, shown as groups 1, 2, 3, 4 and 5.

For this particular device pin 10 was found to have voltage values that dependably match the voltage values for pin 12 (shown in group 4), in the same way the voltage values for pin 9 matches pin 13 (shown in group 3), and the voltage values for pin 3 matches pin 5 (shown in group 1). The reason for the matching of i-v curves for pins is that they have essentially the same IC layout symmetry for the diode and substrate return path. Performance curves are based on (in order of importance) diode sizing and silicon bulk resistance of both $N^-$ and $P^-$ that current pass through to reach contacts back to metallization being same due to layout symmetry on this particular IC. A slightly looser pin group (pins 1, 2, 6, 7, 8, and 14), shown as group 2, still has good i-v curve matching. As noted earlier groups can be split into individual members if that is deemed an advantage for looser groups (due to non-perfect IC layout symmetry).

In addition to verifying matching pins on the packaged IC within the pin group(s), as described above one can verify the spacing between groups for both a minimum and maximum distance (voltage (or current) difference. The difference is a unitless shift (step spacing) percentage which can also be part of the diode signature key. For example the rule can be group 4 pins must be above the group 3 pins with specified minimum gap (spacing). The same rules can apply for group 2 pins to group 1 pins. Group 3 and group 2 pins are adjacent and this can also be verified.

The VCC diode to the GND pin (shown as group 5) will generally be far spaced from other i-v curves. As a result the diode signature key method for detecting bondwire problems for the VCC bondwire will have less improvement over standard techniques, nevertheless a benefit from a gap signature will still apply. VCC is just like other diode only much bigger and lower bulk resistance (basically many diodes in parallel) the self-correlation works best when pins are similar, so by extension of thought a pin dissimilar from all other pins benefits less, but there is still benefit The i-v curves, such as shown in FIG. 7 which can be provided in color for individual groups are suitable for human visualization, and thus for identification of bondwire problems from the pin data from comparison to reference pin data. As described above automated testing with a conventional IC tester can also be used to identify packaged IC pins having bondwire integrity problems. However for automated testing only one current will generally be tested because of speed considerations. Humans are computationally slow but are good at visual interpretation and understanding, where a bad bond sticks out in a color chart for a human. In contrast, for ATE computer-based methods, which just understand numbers with the less the better, every measurement point is valuable time consumed. Also the curves are generally smooth so every current level has the same information. However, higher current levels have more resistance I*(R+B+B) contribution. The current level (or voltage level) selected for test is generally not critical. Better level selections will have distinct matching groups. For this example, a test current level magnitude of 6 mA or greater (from −10 mA to −6 mA) is desirable for this particular device because of a higher I*(R+B+B) contribution to the pin voltage(s) measured.

Figure 8A:
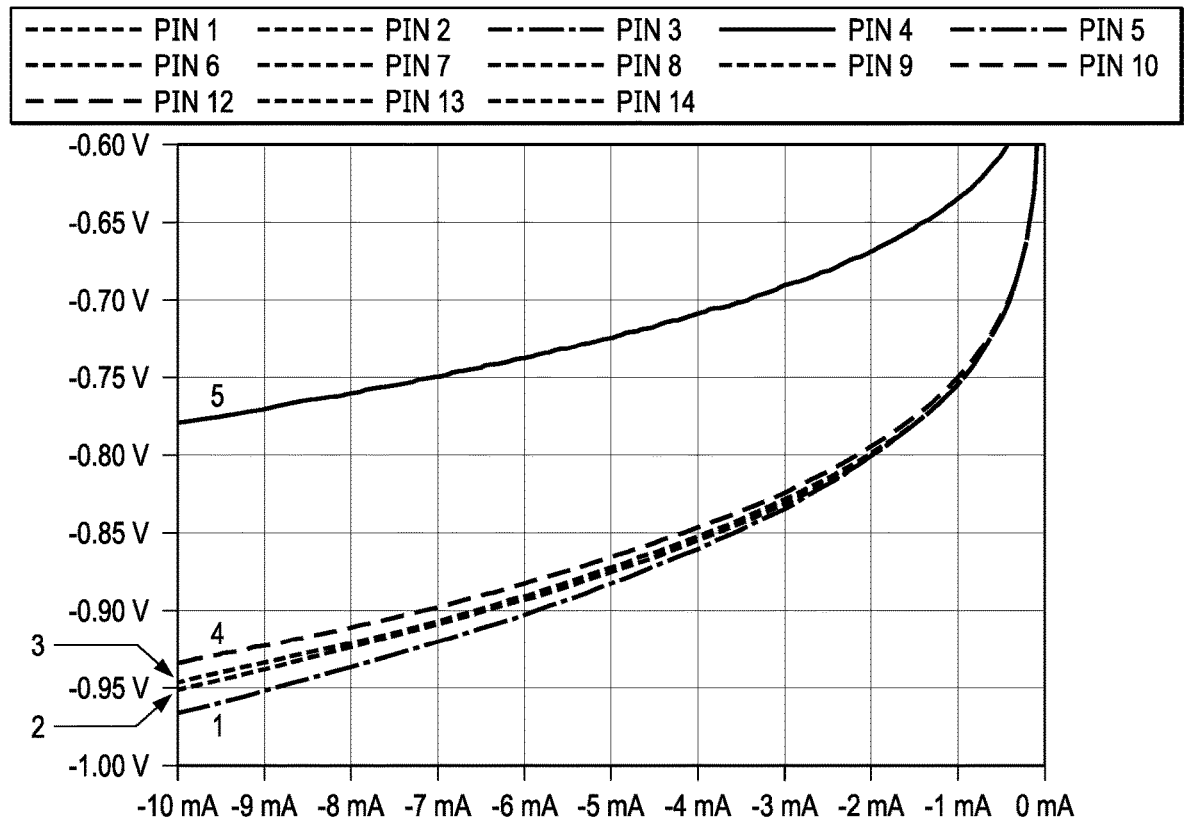
FIGS. 8A-B show an example good diode signature key and an example diode signature for the same IC device having a minor bondwire-related defect, respectively.
Figure 8B:
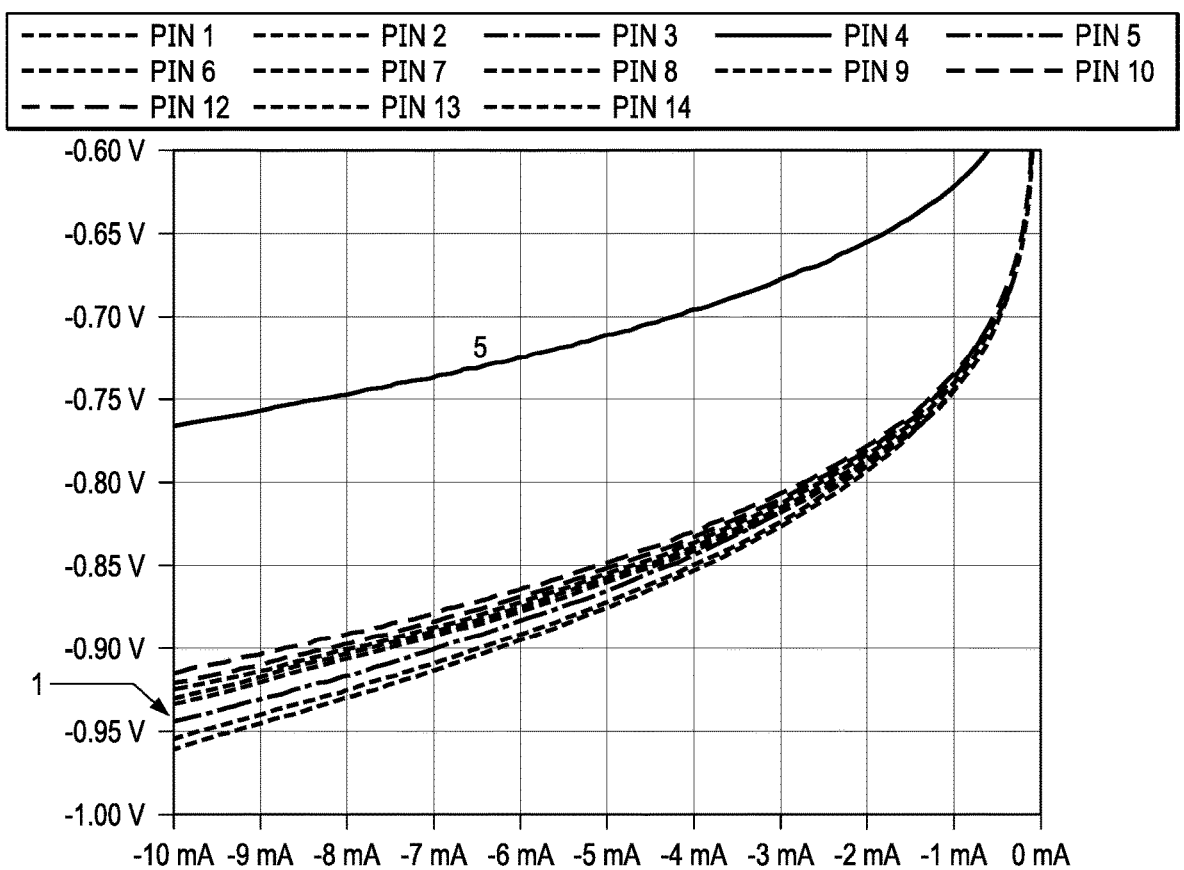

Examples of actual process shifts and bondwire anomalies described below show how the disclosed bondwire testing methodology passes (ignores) process shifts yet fails (detects) bondwire anomalies. FIGS. 8A-B shows an example good diode signature key for a packaged IC and an example signature key for the same IC device having a minor bondwire-related defect, respectively. The good device has group lines shown in FIG. 8A that are nearly overlapping and in a known correct order. The minor defect IC device in FIG. 8B shows non-overlapping lines that are in an incorrect order with group 1 (pins 3 and 5) no longer the bottom curve. This evidences that several pins of this packaged IC device have poor ball bonds, or poor wire quality.

FIGS. 9A-C show an example of implementation of a rapid automated method of bondwire testing a packaged IC device. As noted above a computer only needs to record one point for each pin, such as using a forced current of −10 mA for example. To make comparison of the results obtained easier to understand, absolute values in mV can be used. FIG. 9A shows that using preset control device data or several previous good tested device data, key steps between pins can be generated. This is the known good diode signature key expectation. FIG. 9B shows test result for a device with poor wirebond connections. The DUT reads are converted to step percentages. FIG. 9C shows the difference between the expected (key) steps the actual DUT steps is the error shown. If the error exceeds test limits (example test step levels shown) then device fails. This device is shown having 7 failing steps with darkened backgrounds. (7 detected bad wirebonds).

Those skilled in the art to which this Disclosure relates will appreciate that many other variations are possible within the scope of the claimed invention, and further additions, deletions, substitutions and modifications may be made to the described aspects without departing from the scope of this Disclosure.

The invention claimed is:

1. A method of bondwire integrity testing a packaged integrated circuit (IC) device, comprising:
   forcing a pin current level sufficient to forward bias a parasitic diode to each of a plurality of pins of said IC device relative to a selected common reference pin, said plurality of pins each connected to bond pads on said IC by a bondwire;
   measuring resulting respective pin voltages for said plurality of pins;
   comparing said measured pin voltages to stored pin voltages; and utilizing results from said comparing to determine whether any of said measured pin voltages are significantly different than said stored pin voltages which would identify such significant difference as indicating an additional bonding resistance for at least one of said plurality of pins.

2. The method of claim 1, wherein said at least one pin current level comprises first and second pin current levels.

3. The method of claim 1, further comprising forming a plurality of pin groups from said plurality of pins, each group having a different respective pin voltage range.

4. The method of claim 3, including a spacing between said plurality of pin groups.

5. The method of claim 1, wherein only one said pin current level or one said pin voltage level is tested.

6. The method of claim 1, wherein said reference pin is a common ground for said IC device.

7. The method of claim 1, wherein said reference pin is a power supply pin.

8. A test system testing a packaged integrated circuit (IC) device, comprising:
a processor coupled to control a power supply including a current source that is switchably connected to a contactor for contacting pins of said packaged IC including a plurality of pins and a selected common reference pin, said plurality of pins each connected to bond pads on said IC by a bondwire;
said current source for forcing at least one pin current level for forward biasing parasitic diodes to each of said plurality of pins relative to said reference pin;
a voltage or current monitor coupled to said processor for measuring resulting respective pin voltages or respective pin currents for said plurality of pins, and
said processor with an associated memory for determining a bondwire integrity for said plurality of pins including:
comparing said measured pin voltages to stored pin voltages; and
utilizing results from said comparing to determine whether any of said measured pin voltages are significantly different than said stored pin voltages which would identify such significant difference as indicating an additional bonding resistance for at least one of said plurality of pins.

9. The test system of claim 8, wherein said at least one pin current level comprises first and second pin current levels.

10. The test system of claim 8, further comprising forming a plurality of pin groups from said plurality of pins, each group having a different voltage range.

11. The test system of claim 10, including a spacing between said plurality of pin groups.

12. The test system of claim 8, wherein only one said pin current level or one said pin voltage level is tested.

13. The test system of claim 8, wherein said reference pin is a common ground for said IC device.

14. The test system of claim 8, wherein said reference pin is a power supply pin.

15. A method of bond ire integrity testing a packaged integrated circuit (IC) device, comprising:
forcing a pin voltage level sufficient to forward bias a parasitic diode to each of a plurality of pins of said IC device relative to a selected common reference pin, said plurality of pins each connected to bond pads on said IC by a boadwire;
measuring resulting respective pin currents for said plurality of pins;
comparing said measured pin currents to stored pin currents; and
utilizing results from said comparing to determine whether any of said measured pin currents are significantly different than said stored pin currents which would identify such significant difference as indicating an additional bonding resistance for at least one of said plurality of pins.

16. The method of claim 15, wherein said at least one pin voltage level comprises first and second pin voltage levels.

17. The method of claim 15, further comprising forming a plurality of pin groups from said plurality of pins, each group having a different respective pin current range.

18. The method of claim 17, including a spacing between said plurality of pin groups.

19. The method of claim 15, wherein only one said pin current level or one said pin voltage level is tested.

20. The method of claim 15, wherein said reference pin is a common ground for said IC device.

21. The method of claim 14, wherein said reference pin is a power supply pin.

22. A test system testing a packaged integrated circuit (IC) device, comprising:
a processor coupled to control a power supply including a voltage source that is switchably connected to a contactor for contacting pins of said packaged IC including a plurality of pins and a selected common reference pin, said plurality of pins each connected to bond pads on said IC by a bondwire;
said voltage source for forcing at least one pin voltage level for forward biasing parasitic diodes to each of said plurality of pins relative to said reference pin;
a current monitor coupled to said processor for measuring resulting respective pin currents for said plurality of pins, and
said processor with an associated memory for determining a bondwire integrity for said plurality of pins including;
comparing said measured pin currents to stored pin currents; and
utilizing results from said comparing to determine whether any of said measured pin currents are significantly different than said stored pin currents which would identify such significant difference as indicating an additional bonding resistance for at least one of said plurality of pins.

23. The test system of claim 22, wherein said at least one pin voltage level comprises first and second pin voltage levels.

24. The test system of claim 22, further comprising forming a plurality of pin groups from said plurality of pins, each group having a different current range.

25. The test system of claim 24, including a spacing between said plurality of pin groups.

26. The test system of claim 22, wherein only one said pin voltage level is tested.

27. The test system of claim 22, wherein said reference pin is a common ground for said IC device.

28. The test system of claim 22, wherein said reference pin is a power supply pin.

* * * * *